US012740203B2

(12) United States Patent
Huo et al.

(10) Patent No.: US 12,740,203 B2
(45) Date of Patent: Sep. 15, 2026

(54) POLARIZER, LIGHT EMITTING DEVICE, AND LIGHT EMITTING APPARATUS

(71) Applicant: FUJIAN JING'AN OPTOELECTRONICS CO., LTD., Quanzhou (CN)

(72) Inventors: Yao Huo, Quanzhou City (CN); Bin-Bin Li, Wuhu (CN); Furen Wu, Quanzhou City (CN); Xinyu Qiao, Quanzhou City (CN); Juiping Li, Quanzhou City (CN); Shaohua Huang, Xiamen (CN); Xiaoqiang Zeng, Xiamen (CN); Jianfeng Yang, Xiamen (CN)

(73) Assignee: FUJIAN JING'AN OPTOELECTRONICS CO., LTD., Quanzhou City (CN)

( * ) Notice: Subject to any disclaimer, the term of this patent is extended or adjusted under 35 U.S.C. 154(b) by 403 days.

(21) Appl. No.: 18/240,672

(22) Filed: Aug. 31, 2023

(65) Prior Publication Data

US 2023/0411573 A1 Dec. 21, 2023

Related U.S. Application Data

(63) Continuation-in-part of application No. PCT/CN2021/106680, filed on Jul. 16, 2021.

(51) Int. Cl.
*H10H 20/856* (2025.01)
*G02B 1/14* (2015.01)
(Continued)

(52) U.S. Cl.
CPC ...... *H10H 20/856* (2025.01); *H10H 20/8316* (2025.01); *H10H 20/8514* (2025.01); *H10H 20/853* (2025.01)

(58) Field of Classification Search
CPC ............. H20H 20/872; H20H 20/8506; H20H 20/855; H20H 20/856; G02B 1/14; G02B 5/3058; G02B 5/3025; G02B 5/30
See application file for complete search history.

(56) References Cited

U.S. PATENT DOCUMENTS

2009/0066885 A1 3/2009 Kumai
2013/0250412 A1* 9/2013 Aota .................... G02B 5/3058 359/485.05

(Continued)

FOREIGN PATENT DOCUMENTS

CN 111987202 A 11/2020

OTHER PUBLICATIONS

Search Report issued to PCT application No. PCT/CN2021/106680 on Apr. 13, 2022.

*Primary Examiner* — Antonio B Crite
(74) *Attorney, Agent, or Firm* — MUNCY, GEISSLER, OLDS & LOWE, P.C.

(57) ABSTRACT

A polarizer includes a light-transmissible substrate, a plurality of metal wires, and a protective layer. The light-transmissible substrate has a mounting surface. The metal wires are parallelly arranged on the mounting surface of the light-transmissible substrate. Each of the metal wires extends in a direction parallel to the mounting surface, and has an upper surface and a peripheral surface. The protective layer has a first portion and a plurality of second portions. The first portion covers the upper surface of each of the metal wires and is formed into a continuous structure. Each of the second portions covers the peripheral surface of a respective one of the metal wires. Two adjacent ones of the second portions are spaced apart from each other. A light emitting device including the polarizer and a light emitting apparatus including the light emitting device are also disclosed.

17 Claims, 7 Drawing Sheets

(51) Int. Cl.

| | |
|---|---|
| ***G02B 5/30*** | (2006.01) |
| ***H10H 20/80*** | (2025.01) |
| ***H10H 20/831*** | (2025.01) |
| ***H10H 20/85*** | (2025.01) |
| ***H10H 20/851*** | (2025.01) |
| ***H10H 20/853*** | (2025.01) |
| ***H10H 20/855*** | (2025.01) |

(56) References Cited

U.S. PATENT DOCUMENTS

2019/0391320 A1* 12/2019 Oowada .................... G02B 5/30
2022/0004089 A1* 1/2022 Huang ............... G03B 21/2066

* cited by examiner

POLARIZER, LIGHT EMITTING DEVICE, AND LIGHT EMITTING APPARATUS

CROSS-REFERENCE TO RELATED APPLICATION

This application is a bypass continuation-in-part (CIP) application of PCT International Application No. PCT/CN2021/106680, filed on Jul. 16, 2021, which is incorporated herein by reference in its entirety.

FIELD

The disclosure relates to a polarizer, a light emitting device including the same, and a light emitting apparatus including the same.

BACKGROUND

A conventional polarizer mainly includes a substrate and a plurality of metal wires disposed on the substrate and arranged in parallel with spacings in-between, each spacing has a spacing distance less than a wavelength of light emitted by a light emitting element. That is to say, air gaps are formed between any two adjacent metal wires. Since the polarizer has advantages, such as a high extinction ratio and high transmittance, it can be widely applied in the field of display projection systems. With the demand for higher brightness in the field of display projection systems, a higher thermal resistance for polarizers are consequently required. Therefore, some conventional polarizers in current use include the addition of an organic resin layer. The organic resin layer covers the array of metal wires and fills in each of the air gaps between the metal wires. However, the organic resin layer filled in the air gaps may affect the reflection performance of the metal wires, resulting in a significant reduction in the polarization performance of the polarizer.

SUMMARY

Therefore, an object of the disclosure is to provide a polarizer, a light emitting device including the same, and a light emitting apparatus including the same that can alleviate at least one of the drawbacks of the prior art.

According to a first aspect of the disclosure, the polarizer includes a light-transmissible substrate, a plurality of metal wires, and a protective layer.

The light-transmissible substrate has a mounting surface.

The metal wires are parallelly arranged on the mounting surface of the light-transmissible substrate. Each of the metal wires extends in a direction parallel to the mounting surface, and has an upper surface which is distal from the mounting surface of the light-transmissible substrate and a peripheral surface which extends from a periphery of the upper surface to the mounting surface of the light-transmissible substrate.

The protective layer has a first portion and a plurality of second portions. The first portion covers the upper surface of each of the metal wires and is formed into a continuous structure. Each of the second portions covers the peripheral surfaces of a respective one of the metal wires. Two adjacent ones of the second portions are spaced apart from each other.

In accordance with some embodiments of the present disclosure, each of the second portions has a thickness which is not greater than 40% of a distance between the respective one of the metal wires and an adjacent one of the metal wires that is adjacent to the respective one of the metal wires.

In accordance with some embodiments of the present disclosure, each of the second portions has a thickness which is gradually increased in a direction away from the light-transmissible substrate toward the first portion of the protective layer.

In accordance with some embodiments of the present disclosure, each of the second portions has a thickness which is first gradually decreased and then gradually increased in a direction away from the light-transmissible substrate toward the first portion of the protective layer.

In accordance with some embodiments of the present disclosure, the first portion of the protective layer has a thickness ranges from 10 nm to 500 nm.

In accordance with some embodiments of the present disclosure, the protective layer is made of silicon oxide, silicon nitride, silicon oxynitride, aluminum oxide, titanium oxide or combinations thereof.

In accordance with some embodiments of the present disclosure, the protective layer is made by atomic layer deposition, plasma-enhanced chemical vapor deposition (PECVD) or high density plasma chemical vapor deposition (HDPCVD).

In accordance with some embodiments of the present disclosure, the protective layer includes a first sublayer adjacent to the metal wires, and a second sublayer formed on the first sublayer opposite to the metal wires.

In accordance with some embodiments of the present disclosure, the first sublayer is made by atomic layer deposition, and the second sublayer is made by PECVD or HDPCVD.

In accordance with some embodiments of the present disclosure, the first sublayer has a density higher than that of the second sublayer.

According to a second aspect of the disclosure, the light emitting device includes an epitaxial stack and the polarizer as mentioned above.

The epitaxial stack has a light emitting surface for at least a part of light generated by the epitaxial stack emitting outwardly therefrom.

The polarizer is disposed on the light emitting surface of the epitaxial stack.

In accordance with some embodiments of the present disclosure, the light emitting device further includes an intermediate layer disposed between the light emitting surface of the epitaxial stack and the polarizer. The intermediate layer is a wavelength conversion layer, a transparent insulating layer, or a transparent conductive layer.

In accordance with some embodiments of the present disclosure, each of the second portions has a thickness which is not greater than 40% of a distance between the respective one of the metal wires and an adjacent one of the metal wires that is adjacent to the respective one of the metal wires.

In accordance with some embodiments of the present disclosure, each of the second portions has a thickness which is gradually increased in a direction away from the light-transmissible substrate toward the first portion of the protective layer.

In accordance with some embodiments of the present disclosure, each of the second portions has a thickness which is first gradually decreased and then gradually increased in a direction away from the light-transmissible substrate toward the first portion of the protective layer.

In accordance with some embodiments of the present disclosure, the protective layer is made of silicon oxide, silicon nitride, silicon oxynitride, aluminum oxide, titanium oxide or combinations thereof.

In accordance with some embodiments of the present disclosure, the protective layer includes a first sublayer adjacent to the metal wires, and a second sublayer formed on the first sublayer opposite to the metal wires.

In accordance with some embodiments of the present disclosure, the first sublayer is made by atomic layer deposition, and the second sublayer is made by PECVD or HDPCVD.

In accordance with some embodiments of the present disclosure, the first sublayer has a density higher than that of the second sublayer.

According to a third aspect of the disclosure, the light emitting apparatus including a bracket, the light emitting device as mentioned above, and an encapsulant.

The light emitting device is disposed on the bracket. The encapsulant encapsulates the light emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
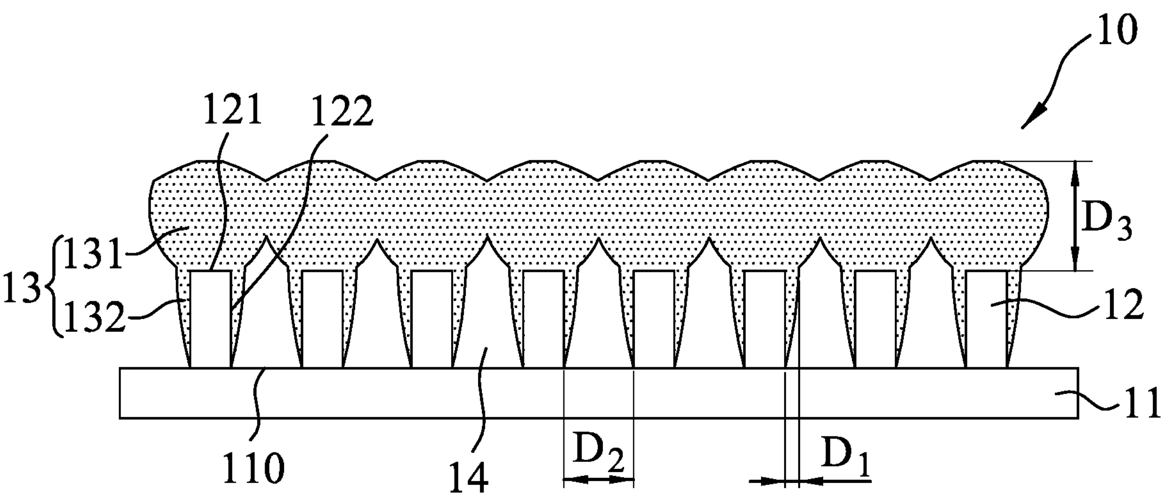
FIG. 1 is a schematic cross-sectional view illustrating an embodiment of a polarizer according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as “top,” “bottom,” “upper,” “lower,” “on,” “above,” “over,” “downwardly,” “upwardly” and the like may be used throughout the disclosure while making reference to the features as illustrated in the drawings. The features may be oriented differently (e.g., rotated 90 degrees or at other orientations) and the spatially relative terms used herein may be interpreted accordingly.

Referring to FIG. 1, an embodiment of a polarizer 10 according to the disclosure is provided. The polarizer 10 includes a light-transmissible substrate 11 (e.g., a transparent substrate) having a mounting surface 110, a plurality of metal wires 12, and a protective layer 13. The metal wires 12 are parallelly arranged on the mounting surface 110 of the light-transmissible substrate 11, and are spaced apart from one another. Each of the metal wires 12 extends in an extending direction parallel to the mounting surface 110, and has an upper surface 121 which is distal from the mounting surface 110 of the light-transmissible substrate 11 and a peripheral surface 122 which extends from a periphery of the upper surface 121 to the mounting surface 110 of the light-transmissible substrate 11. Here, the extending direction of each of the metal wires 12 refers to a direction extending into the page shown in FIG. 1. Materials for making the metal wires 12 may include, but are not limited to, aluminum. The protective layer 13 has a first portion 131 and a plurality of second portions 132. The first portion 131 covers the upper surface 121 of each of the metal wires 12 and is formed into a continuous structure. Each of the second portions 132 covers the peripheral surface 122 of a respective one of the metal wires 12. Two adjacent ones of the second portions 132 are spaced apart from each other by a gap 14.

With the protective layer 13 covering the upper surface 121 and the peripheral surface 122 of each of the metal wires 12, the metal wires 12 can be protected from being oxidized or corroded due to contact with the external environment, thereby improving heat resistance and reliability of the polarizer 10. In addition, with the design of leaving the gap 14 between two adjacent ones of the second portions 132, the light-polarizing performance of the polarizer 10 can be further enhanced. The first portion 131 may serve as a micro-lens so as to improve the light extraction efficiency of the polarizer 10. Moreover, in a case where the aforementioned polarizer 10 is applied to a light emitting diode used in a lighting device, and the lighting device is transferred using a blue film or a white film (with the polarizer 10 attaching to the blue film or the white film) during fabrication, the metal wires 12 can be protected from being peeled off from the light-transmissible substrate 11 when tearing off the blue film or the white film since adhesion between the protective layer 13 and the blue film or the white film is relatively poor and the first portion 131 of the protective layer 13 is a continuous structure. Accordingly, the peeling resistance of the polarizer 10 can be improved.

Referring again to FIG. 1, in certain embodiments, the first portion 131 of the protective layer 13 has a thickness ($D_3$) that ranges from 10 nm to 500 nm. In some embodiments, each of the second portions 132 has a thickness ($D_1$) which is not greater than 40% of a distance ($D_2$) between the respective one of the metal wires 12 and an adjacent one of the metal wires 12 that is adjacent to the respective one of the metal wires 12 (i.e., between two adjacent ones of the metal wires 12). In an exemplary embodiment, the thickness ($D_1$) of each of the second portions 132 is not greater than 15% of the distance ($D_2$) between the respective one of the metal wires 12 and the adjacent one of the metal wires 12 so that the gap 14 formed between two adjacent ones of the second portions 132 becomes greater, thereby ensuring the polarizer 10 has a good light-polarizing performance. In other embodiments, the thickness ($D_1$) of each of the second portions (132) is gradually increased in a direction away from the light-transmissible substrate 11 toward the first portion 131 of the protective layer 13 so as to obtain a gradient change in refractive index in a region between two adjacent ones of the metal wires 12 and hence further reduce light loss due to reflection, thereby boosting the light extraction efficiency of the polarizer 10. In addition, the second portions 132 may have a coefficient of thermal expansion (CTE) varying in gradient in a direction from the light-transmissible substrate 11 to the first portion 131 of the protective layer 13 so as to buffer thermal stress that the second portions 132 may suffer from especially in a high-temperature environment where significant thermal stress imposed on the second portions 312.

Figure 2:
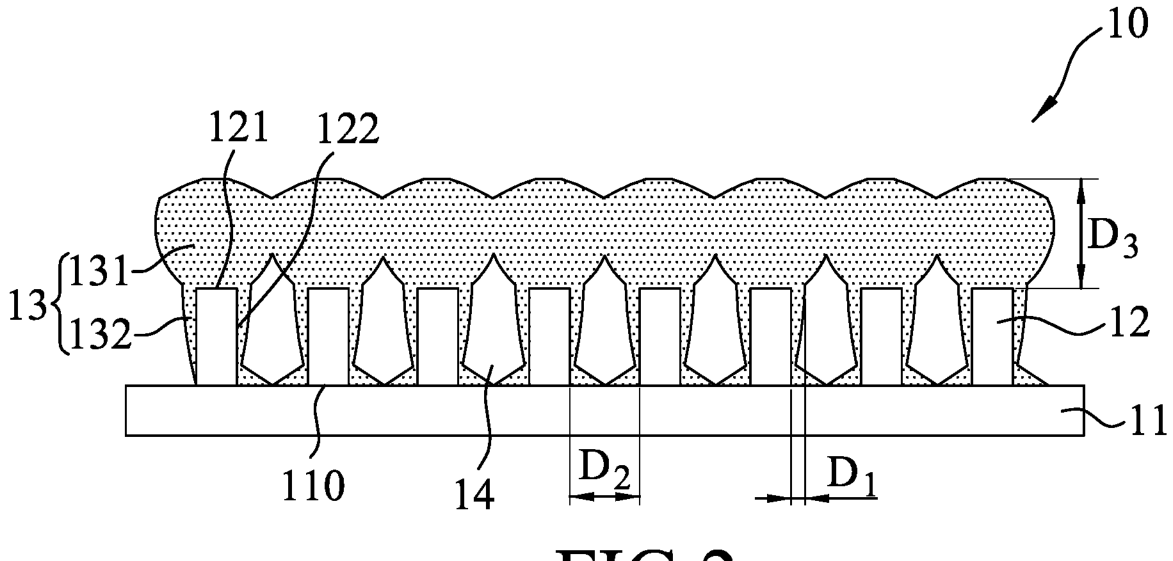
FIG. 2 is a schematic cross-sectional view illustrating a modification of the polarizer of FIG. 1.

Referring to FIG. 2, in a modification of the embodiment shown in FIG. 1, each of the second portions 132 has a thickness ($D_1$) which is first gradually decreased (i.e., a lower part of the second portion) and then gradually increased (i.e., an upper part of the second portion) in the direction away from the light-transmissible substrate 11 toward the first portion 131 of the protective layer 13. The upper part of each of the second portions 132 may have the thickness ($D_1$) which is not greater than 40% of the distance ($D_2$) between the respective one of the metal wires 12 and the adjacent one of the metal wires 12. For example, the thickness ($D_1$) may be not greater than 15% of the aforesaid distance ($D_2$). In an exemplary embodiment, an outer surface of the first portion 131 is an arc-shaped surface, and an outer surface of each of the second portions 132 is an arc-shaped surface. In another exemplary embodiment, the protective layer 13 is made by atomic layer deposition (ALD), plasma-enhanced chemical vapor deposition (PECVD) or high-density plasma chemical vapor deposition (HDPCVD). In still another exemplary embodiment, the protective layer 13 is made of silicon oxide, silicon nitride, silicon oxynitride, aluminum oxide, titanium oxide or combinations thereof.

The protective layer 13 may be made by a variety of techniques. In an exemplary embodiment, the protective layer 13 is made by two techniques. In some embodiments, the protective layer 13 includes a first sublayer adjacent to the metal wires 12, and a second sublayer formed on the first sublayer opposite to the metal wires 12. Each of the first sublayer and the second sublayer may be made independently of silicon oxide, silicon nitride, silicon oxynitride, aluminum oxide, titanium oxide or combinations thereof. That is to say, each of the first sublayer and the second sublayer may be made of the same material or different materials. In an exemplary embodiment, the first sublayer has a density higher than that of the second sublayer. The first sublayer and the second sublayer may be made by different techniques. For example, the first sublayer may be an atomic layer deposition layer made by atomic layer deposition, and the second sublayer may be a plasma-enhanced chemical vapor deposition layer or a high density plasma chemical vapor deposition layer respectively made by PECVD or HDPCVD.

Since the protective layer 13 may be made of inorganic material(s), such as silicon oxide, silicon nitride, silicon oxynitride, aluminum oxide and/or titanium oxide, the protective layer 13 has a higher temperature resistance. Additionally, because of the relatively poor adhesion between the protective layer 13 and the aforesaid blue film/white film, the metal wires 12 can be protected from being peeled off the transmissible substrate 11 during the transferring process, thereby improving the peeling resistance of the polarizer 10.

When the protective layer 13 has a laminated structure as described above where the first sublayer has a density that is higher than that of the second sublayer, the protective effect of the protective layer 13 on the metal wires 12 can be further enhanced.

Figure 3:
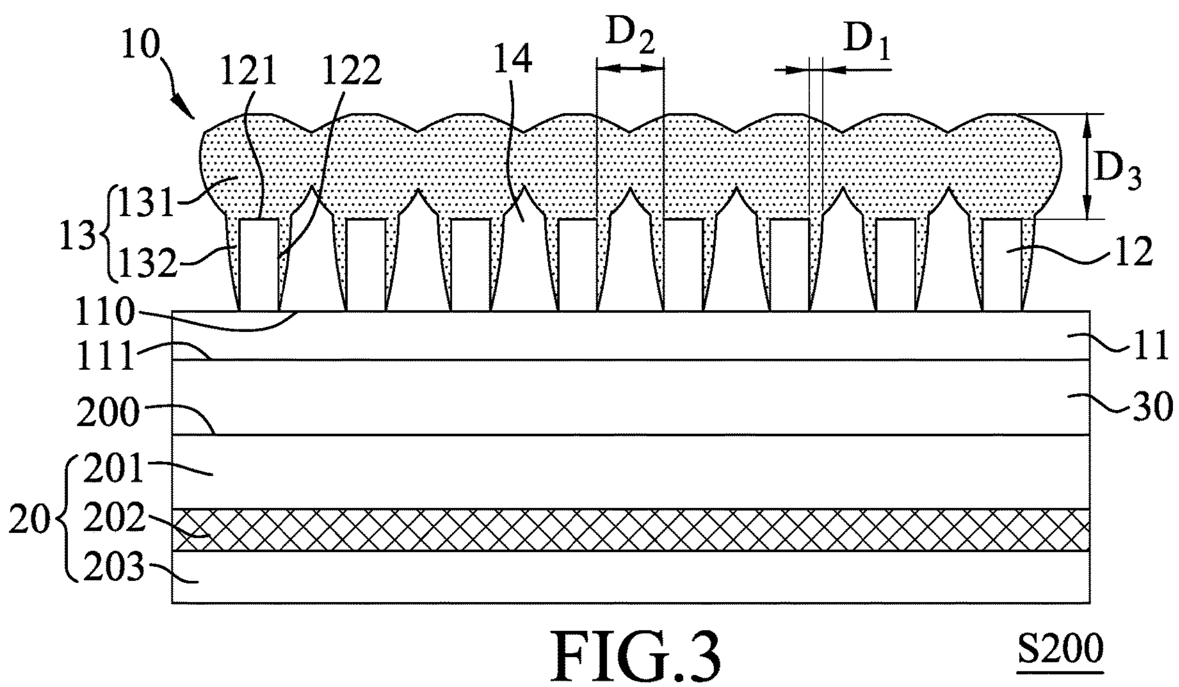
FIG. 3 is a schematic cross-sectional view illustrating a first embodiment of a light emitting device according to the disclosure.

Referring to FIG. 3, a first embodiment of a light emitting device S200 according to the disclosure is provided. The light emitting device S200 includes an epitaxial stack 20, and the polarizer 10 as described above. The epitaxial stack 20 includes a first-type semiconductor layer 201, a second-type semiconductor layer 203, and an active layer 202 disposed therebetween. The first-type semiconductor layer 201 may be electrically connected to a first electrode (not shown), and the second-type semiconductor layer 203 may be electrically connected to a second electrode (not shown).

The epitaxial stack 20 has alight emitting surface 200 where at least a portion of the light generated by the active layer 202 of the epitaxial stack 20 is emitted outwardly therefrom. The polarizer 10 is disposed on the light emitting surface 200 of the epitaxial stack 10. As mentioned above, the polarizer 10 includes the light-transmissible substrate 11 having the mounting surface 110, the metal wires 12 and the protective layer 13. The metal wires 12 are parallelly arranged on the mounting surface 110 of the light-transmissible substrate 11. Each of the metal wires 12 extends in the extending direction parallel to the light emitting surface 200, and has the upper surface 121 which is distal from the mounting surface 110 of the light-transmissible substrate 11 and the peripheral surface 122 which extends from the periphery of the upper surface 121 to the mounting surface 110 of the light-transmissible substrate 11. The extending direction of each of the metal wires 12 herein refers to a direction extending into the page. As mentioned previously, the materials for making the metal wires 12 may include, but are not limited to, aluminum. The protective layer 13 has the first portion 131 and the second portions 132. The first portion 131 covers the upper surface 121 of each of the metal wires 12 and is formed into a continuous structure. Each of the second portions 132 covers the peripheral surface 122 of the respective one of the metal wires 12. Two adjacent ones of the second portions 132 are spaced apart from each other. That is to say, there is a gap 14 that is formed between two adjacent ones of the second portions 132.

When the light emitting device S200 has the polarizer 10, where the protective layer 13 is provided for covering the upper surface 121 and the peripheral surface 122 of each of the metal wires 12, as mentioned above, the metal wires 12 can be protected from being oxidized or corroded, thereby improving heat resistance and reliability of the polarizer 10. Meanwhile, since the gap 14 exists between two adjacent ones of the second portions 132, the light-polarizing performance of the polarizer 10 and the light emitting device S200 can be further enhanced. Because the first portions 131 covering the upper surface 121 of each of the metal wires 12 is formed into a continuous structure, the first portion 131 can serve as a micro-lens so as to improve the light extraction efficiency of the light emitting device S200. In addition, because of the relatively poor adhesion between the protective layer 13 and the blue film/white film and the first portion 131 of the protective layer 13 having continuous structure, the metal wires 12 can be protected from being peeled off from the light-transmissible substrate 11, thereby enhancing the peeling resistance of the polarizer 10 and the light emitting device S200.

Referring again to FIG. 3, the light-transmissible substrate 11 may further include a binding surface 111. When the light emitting device S200 is a flip-chip light emitting device emitting light in a single band of wavelength in the blue, red or green range of the electromagnetic spectrum, the light emitting device S200 may further include a transparent supporting substrate 30 disposed between the polarizer 10 and the epitaxial stack 20. The light emitting surface 200 can be joined to the binding surface 111 of the light-transmissible substrate 11 through the transparent supporting substrate 30. Accordingly, light emitted from the light emitting surface 200 of the epitaxial stack 20 passes through the transparent supporting substrate 30 and the polarizer 10 sequentially so as to emit light upwardly and outwardly. In other embodiments, the binding surface 111 may be directly attached to the light emitting surface 200 when the transparent supporting substrate 30 is omitted. The transparent supporting substrate 30 may be a sapphire substrate, a gallium arsenide substrate, a silicon substrate, a ceramic substrate or a silicon carbide substrate.

Figure 4:
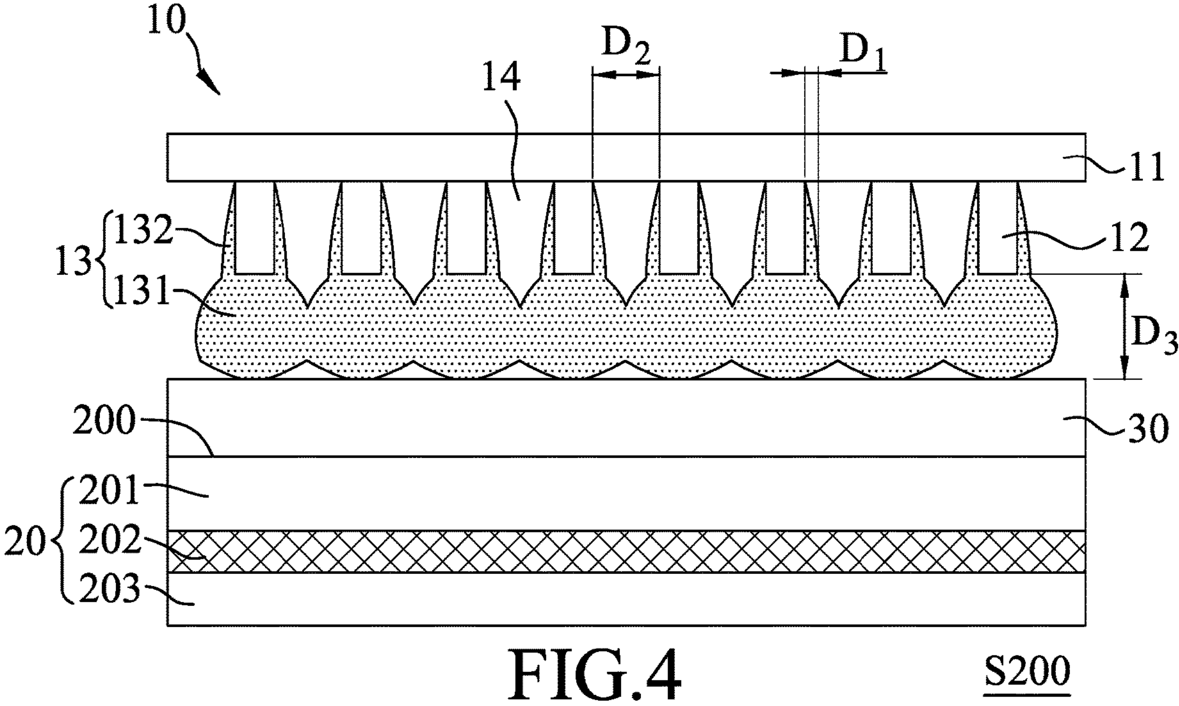
FIG. 4 is a schematic cross-sectional view illustrating a modification of the light emitting device of FIG. 3.

Referring to FIG. 4, the polarizer 10 may be joined to the transparent supporting substrate 30, or instead, be joined to the light emitting surface 200 by the protective layer 13. When the light emitting device S200 is a flip-chip light emitting device emitting light in a single band of wavelength in the blue, red or green range of the electromagnetic spectrum, the light emitting device S200 my further include a transparent supporting substrate 30 disposed between the polarizer 10 and the epitaxial stack 20. Therefore, the light emitting surface 200 is jointed to the protective layer 13 through the transparent supporting substrate 30. Accordingly, light emitted from the light emitting surface 200 of the epitaxial stack 20 passes through a light emitting surface of the transparent supporting substrate 30 and a light emitting surface of the polarizer 10 sequentially so as to emit light upwardly and outwardly.

Figure 5:
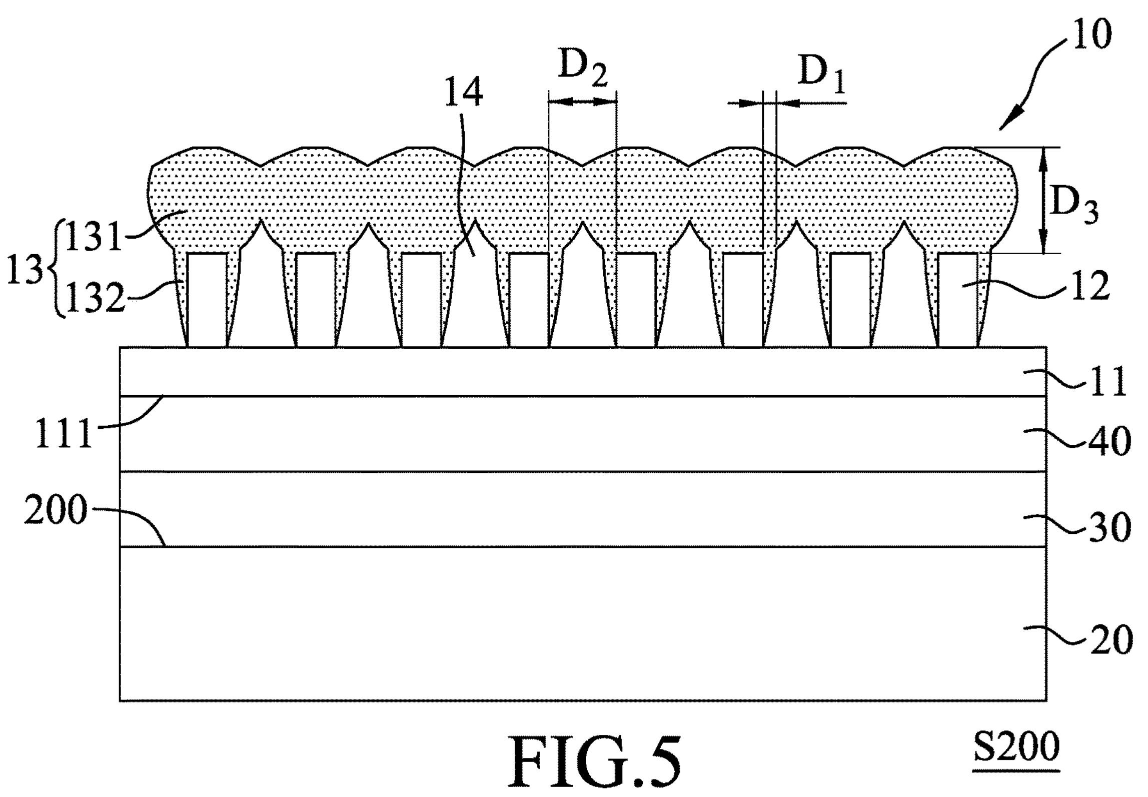
FIG. 5 is a schematic cross-sectional view illustrating a second embodiment of the light emitting device according to the disclosure.

Referring to FIG. 5, a second embodiment of the light emitting device S200 according to the disclosure is provided. The light emitting device S200 includes an epitaxial stack 20, the aforementioned polarizer 10 and an intermediate layer 40 disposed between a light emitting surface 200 of the epitaxial stack 20 and the polarizer 10. The epitaxial stack 20 has a structure similar to that of the first embodiment of the light emitting device S200 as shown in FIG. 3. The binding surface 111 of the light-transmissible substrate 11 may be joined to the light emitting surface 200 of the epitaxial stack 20 through the intermediate layer 40. The intermediate layer 40 may be, but is not limited to, a wavelength conversion layer, a transparent insulating layer, or a transparent conductive layer.

Specifically, when the light emitting device S200 is a white light emitting device, the intermediate layer 40 is the wavelength conversion layer. The light emitting surface 200 of the epitaxial stack 20 is joined to a binding surface 111 of the light-transmissible substrate 11 through the wavelength conversion layer.

Referring again to FIG. 5, the light emitting device S200 further includes a transparent supporting substrate 30. The transparent supporting substrate 30 is disposed on the light emitting surface 200. The binding surface 111 of the light-transmissible substrate 11 is joined to the transparent supporting substrate 30 through the intermediate layer 40. The transparent supporting substrate 30 may be a sapphire substrate, a gallium arsenide substrate, a silicon substrate, a ceramic substrate or a silicon carbide substrate.

Figure 6:
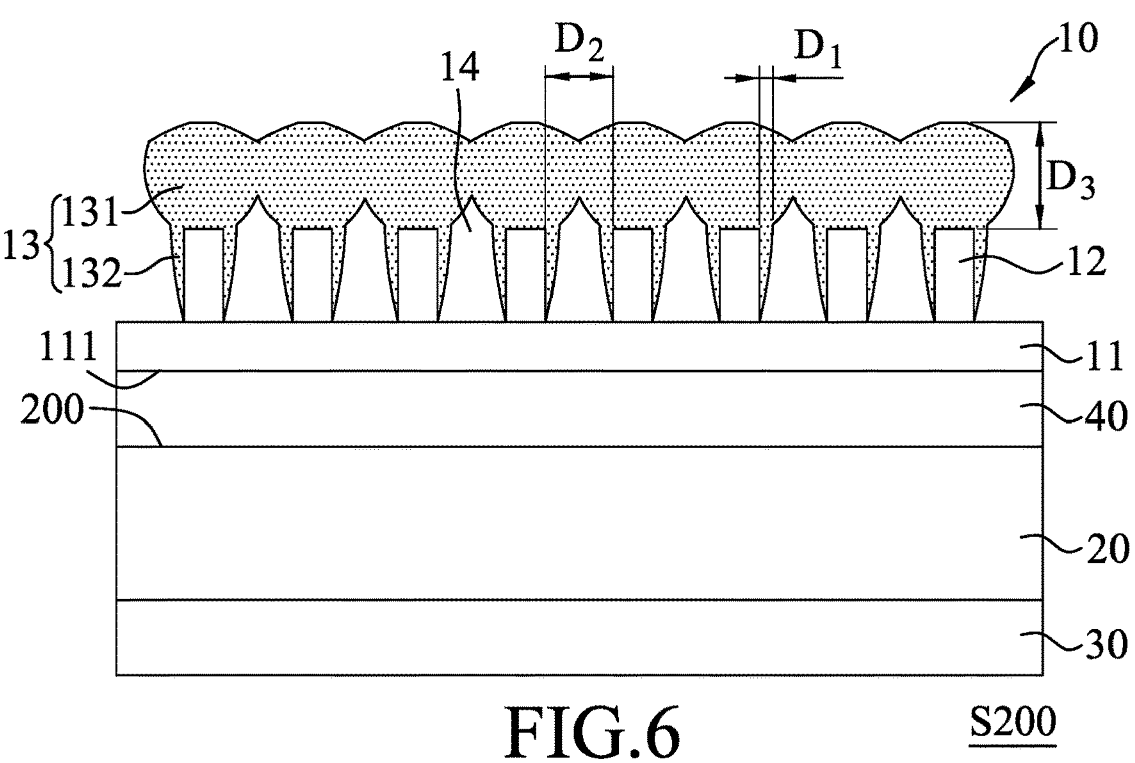
FIG. 6 is a schematic cross-sectional view illustrating a modification of the light emitting device of FIG. 5.

Referring to FIG. 6, in a modification of the second embodiment of the light emitting device S200, the transparent supporting substrate 30 of the light emitting device S200 is deposed on a surface of the epitaxial stack 20 opposite to the light emitting surface 200.

In some embodiments, the light emitting surface 200 is a non-flat surface. The non-flat surface has irregular and aperiodic patterns. In addition, the light emitting device S200 may further include a reflective layer (e.g., mirror reflective layer, not shown) disposed on one side of the epitaxial stack 20 that is distal from the polarizers 10. In other embodiments, the reflective layer is disposed between the transparent supporting substrate 30 and the epitaxial stack 20, and includes a reflective metal layer, a distributed Bragg reflector (DBR), or an omni-directional reflector (ODR). With the design of the light emitting surface 200, the reflective layer and the polarizer 10, the light emitting device S200 may further possess multiple light-extraction features, thereby improving light utilization.

In some embodiments, the light emitting surface 200 is a flat surface. The light emitting device S200 may include a non-flat layer disposed on the flat light emitting surface 200 so that light radiating from the light emitting surface 200 passes through the non-flat layer to emit outwardly. As shown in FIG. 6, the intermediate layer 40 (e.g., a wavelength conversion layer, a transparent insulating layer or a transparent conductive layer) can serve as the aforesaid non-flat layer. The non-flat layer has a non-flat surface that is distal from the light emitting surface 200. The non-flat surface has irregular and aperiodic patterns. Moreover, as described previously, in such embodiments, the mirror reflective layer (including the reflective metal layer, the distributed Bragg reflector (DBR), or the omni-directional reflector (ODR)) may be disposed on a surface of the epitaxial stack 20 that is distal from the polarizers 10. With the design of the non-flat layer, the mirror reflective layer and the polarizer 10, the light emitting device S200 may further possess multiple light-extraction features, thereby improving light utilization.

As described above in FIG. 3, the first portion 131 of the protective layer 13 has the thickness ($D_3$) (in a stacking direction from the light-transmissible substrate 11 to the protective layer 13) that ranges from 10 nm to 500 nm. In addition, each of the second portions 132 has the thickness ($D_1$) (in a direction extending laterally from the peripheral surface 122 of the respective one of the metal wires 12) which is not greater than 40% of the distance ($D_2$) between the respective one of the metal wires 12 and an adjacent one of the metal wires 12 that is adjacent to the respective one of the metal wires 12. In an exemplary embodiment, the thickness (D1) of each of the second portions 132 is not greater than 15% of the distance ($D_2$), as foresaid, so that the gap 14 formed between two adjacent ones of the second portions 132 becomes greater, thereby ensuring that the polarizer 10 has good light-polarizing performance. In other embodiments, each of the second portions 132 has a thickness ($D_1$) which is gradually increased in the direction away from the light-transmissible substrate 11 toward the first portion 131 of the protective layer 13 so as to obtain the gradient change in the refractive index in the region between two adjacent ones of the metal wires 12 and hence further reduce light loss due to light reflection, thereby enhancing the light extraction efficiency of the polarizer 10. In addition, the gradient variation of the thickness ($D_1$) of each of the second portions 132 in the above-mentioned direction, i.e., increasing from the light-transmissible substrate 11 toward the first portion 131, can have an effect of buffering thermal stress, especially in a high-temperature environment.

In some embodiments, as described above in FIG. 2, the thickness ($D_1$) of each of the second portions 132 is first gradually decreased (i.e., the lower part) and then gradually increased (i.e., the upper part) in the direction away from the light-transmissible substrate 11 toward the first portion 131 of the protective layer 13. The upper part of each of the second portions 132 has the thickness ($D_1$) which is not greater than 40% of the distance ($D_2$) between the respective one of the metal wires 12 and the adjacent one of the metal wires 12. In an exemplary embodiment, the thickness ($D_1$) of the upper part of each of the second portions 132 is not greater than 15% of the foregoing distance ($D_2$).

In another exemplary embodiment, an outer surface of the first portion 131, which is distal from the metal wires 12, is an arc-shaped surface, and an outer surface of each of the second portions 132, which is distal from the metal wires 12, is an arc-shaped surface.

In certain embodiments, the protective layer 13 may be, but is not limited to, an atomic layer deposition layer, a high-density plasma chemical vapor deposition layer, or a plasma-enhanced chemical vapor deposition layer. Materials for making the protective layer 13 include, but are not limited to, silicon oxide, silicon nitride, silicon oxynitride, aluminum oxide, titanium oxide, or combinations thereof.

The protective layer 13 may be made by a variety of techniques (e.g., atomic layer deposition, HDPCVD, etc.). In an exemplary embodiment, the protective layer 13 is made by two techniques. The protective layer 13 includes a first sublayer adjacent to the metal wires 12, and a second sublayer formed on the first sublayer opposite to the metal wires 12. Moreover, the first sublayer has a density that is higher than that of the second sublayer. The first sublayer and the second sublayer may be made by different techniques. Materials for making the first sublayer and the second sublayer may independently include, but are not limited to, silicon oxide, silicon nitride, silicon oxynitride, aluminum oxide, titanium oxide or combinations thereof. In this embodiment, the first sublayer is an atomic layer deposition layer made by atomic layer deposition. The second sublayer is be a plasma-enhanced chemical vapor deposition layer or a high density plasma chemical vapor deposition layer respectively made by PECVD or HDPCVD.

The protective layer 13 may be made of inorganic material(s), such as silicon oxide, silicon nitride, silicon oxynitride, aluminum oxide and/or titanium oxide, and hence can have a higher temperature resistance. Since the adhesion between the protective layer 13 and the blue film is relatively poor, the metal wires 12 can be protected from being peeled off from the light-transmissible substrate 11 during the transferring process, thereby improving the peeling resistance of the polarizer 10 and the light emitting device S200. When the protective layer 13 has a laminated structure as described above where the first sublayer has a density that is higher than that of the second sublayer, the protective effect of the protective layer 13 on the metal wires 12 can be further enhanced.

Figure 7:
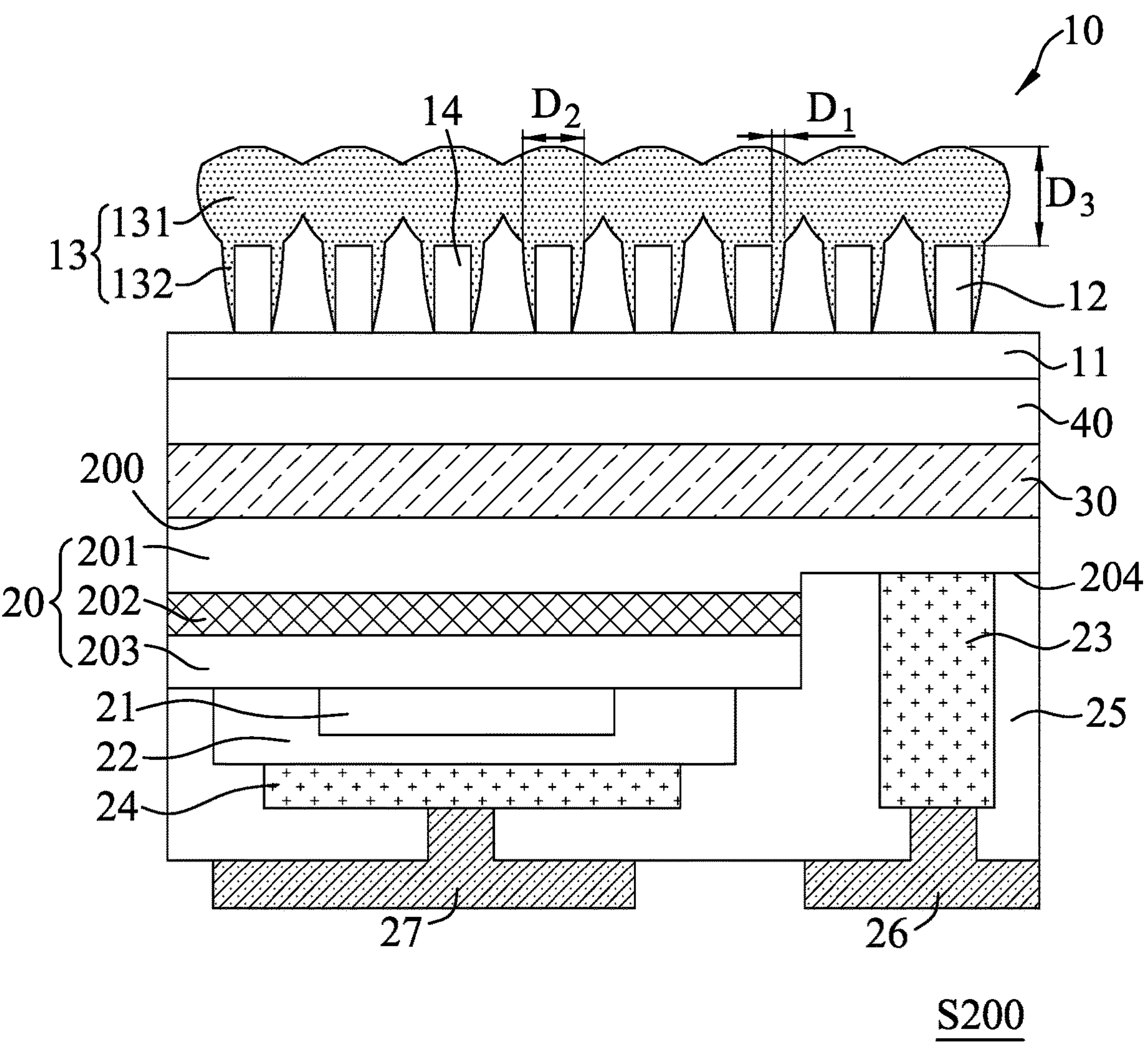
FIG. 7 is a schematic cross-sectional view illustrating a third embodiment of the light emitting device according to the disclosure.
Figure 8:
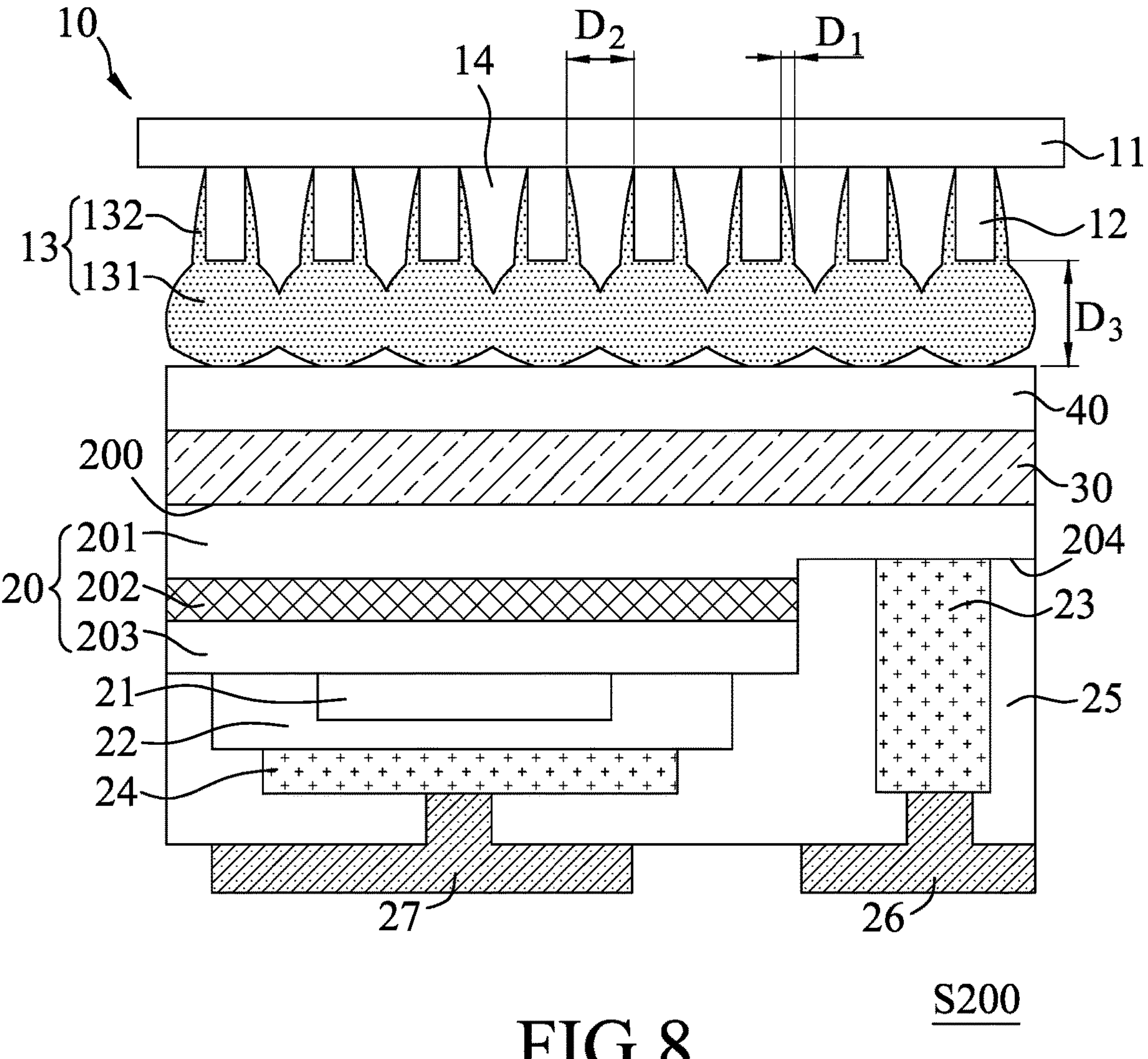
FIG. 8 is a schematic cross-sectional view illustrating a modification of the light emitting device of FIG. 7.

Referring to FIG. 7 and FIG. 8, a third embodiment of the light emitting device S200 according to the disclosure is provided. The light emitting device S200 of this embodiment has the epitaxial stack 20, the transparent supporting substrate 30, the intermediate layer 40 and the polarizer 10 as shown in FIG. 5. The epitaxial stack 20 includes, from top to bottom, the first-type semiconductor layer 201, the active layer 202, and the second-type semiconductor layer 203. An upper surface of the epitaxial stack 20 is the light emitting surface 200. In addition, there is a recess 204 formed at a lower surface of the epitaxial stack 20. The recess 204 is indented from the second-type semiconductor layer 203 to the first-type semiconductor layer 201 so as to expose the first-type semiconductor layer 201. The light-emitting device S200 further includes a first electrode 23 formed in the recess 204, and a second electrode 24 formed in a region within the lower surface of the epitaxial stack 20 other than that of the recess 204 (i.e., formed on a bottom surface of the second-type semiconductor layer 203). Moreover, the light emitting device S200 further includes an insulating layer 25 formed on the lower surface of the epitaxial stack 20. The insulating layer 25 has two through holes corresponding to the positions of the first electrode 23 and the second electrode 24, respectively. In addition, the light emitting device S200 further includes a first pad 26 and a second pad 27 formed on the insulating layer 25. The first pad 26 extends into the through hole corresponding to the position of the first electrode 23, and hence is in contact with the first electrode 23. The second pad 27 extends into the through hole corresponding to the position of the second electrode 24, and hence is in contact with the second electrode 24. In this embodiment, the first-type semiconductor layer 201 is an N-type semiconductor layer, the second-type semiconductor layer 203 is a P-type semiconductor layer, and the active layer 202 is a multiple quantum well structure.

In this embodiment, the intermediate layer 40 is a wavelength conversion layer. In some embodiments, the light emitting surface 200 is a non-flat surface, and light is emitted upwardly through the transparent supporting substrate 30. The non-flat surface has irregular and aperiodic patterns. In this embodiment, the non-flat surface may be made by dry etching or wet etching. For dry etching, an appropriate chemical composition of plasma and a plasma power supply should be provided. For wet etching, a suitable etching solution should be provided, and an appropriate temperature is also necessary.

In some embodiments, the light-emitting device S200 further includes a current blocking layer 21 and a transparent conductive layer 22 sequentially formed in the region within the lower surface of the epitaxial stack 20 other than that of the recess 204 (i.e., the bottom surface of the second-type semiconductor layer 203). The second electrode 24 is formed on the transparent conductive layer 22.

Referring to FIG. 8, a modification of the third embodiment of the light emitting device S200 of FIG. 7 is provided. The difference between FIG. 7 and FIG. 8 is described below. In FIG. 7, the polarizer 10 is disposed on the epitaxial stack 20 with the light-transmissible substrate 11 facing toward the epitaxial stack 20; in FIG. 8, the polarizer 10 is disposed on the epitaxial stack 20 in a manner that the protective layer 13 is instead facing toward the epitaxial stack 20.

Figure 9:
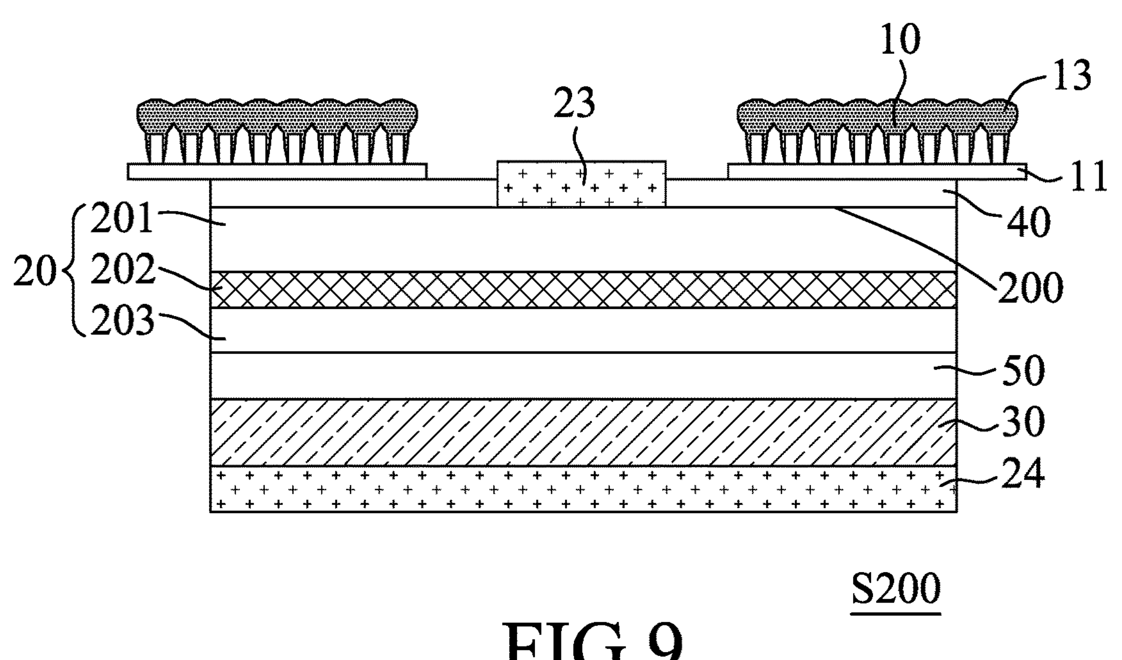
FIG. 9 is a schematic cross-sectional view illustrating a fourth embodiment of the light emitting device according to the disclosure.

Referring to FIG. 9, a fourth embodiment of a light emitting device S200 according to the disclosure is provided. The light emitting device S200 includes the semiconductor stack 20, the transparent supporting substrate 30 and the intermediate layer 40 as shown in FIG. 5. The epitaxial stack 20 includes, from top to bottom, the first-type semiconductor layer 201, the active layer 202, and the second-type semiconductor layer 203. The upper surface of the epitaxial stack 20 is the light emitting surface 200. The light emitting device S200 includes a first electrode 23 disposed on the light emitting surface 200. The intermediate layer 40 is disposed in a region within the light emitting surface 200 other than that occupied by the first electrode 23. The intermediate layer 40 may be a transparent insulating layer. The polarizer 10 is disposed on the intermediate layer 40. The light emitting device further includes a metal layer 50 and a second electrode 24. A lower surface of the epitaxial stack 20 is adhered to the transparent supporting substrate 30 by the metal layer 50. The transparent supporting substrate 30 may be a conductive substrate. The second electrode 24 is disposed on a surface of the transparent supporting substrate 30 that is distal from the epitaxial stack 20. In this embodiment, the first-type semiconductor layer 201 is an N-type semiconductor layer, the second-type semiconductor layer 203 is a P-type semiconductor layer, and the active layer 202 is a multiple quantum well structure.

In some embodiments, the light emitting surface 200, except for the area occupied by the first electrode 23, is a non-flat surface. The non-flat surface has irregular and aperiodic patterns. In this embodiment, the non-flat surface may be made by dry etching or wet etching. For dry etching, an appropriate chemical composition of a plasma and a plasma power supply should be provided. For wet etching, a suitable etching solution should be provided, and an appropriate temperature is also necessary.

In some embodiments, the light emitting device S200 further includes a mirror reflective layer (not shown) disposed between the metal layer 50 and the epitaxial stack 20. The mirror reflective layer may include a reflective metal layer, a distributed Bragg reflector (DBR), or an omni-directional reflector (ODR), and is mainly used for increasing light output toward the light emitting surface 200.

Figure 10:
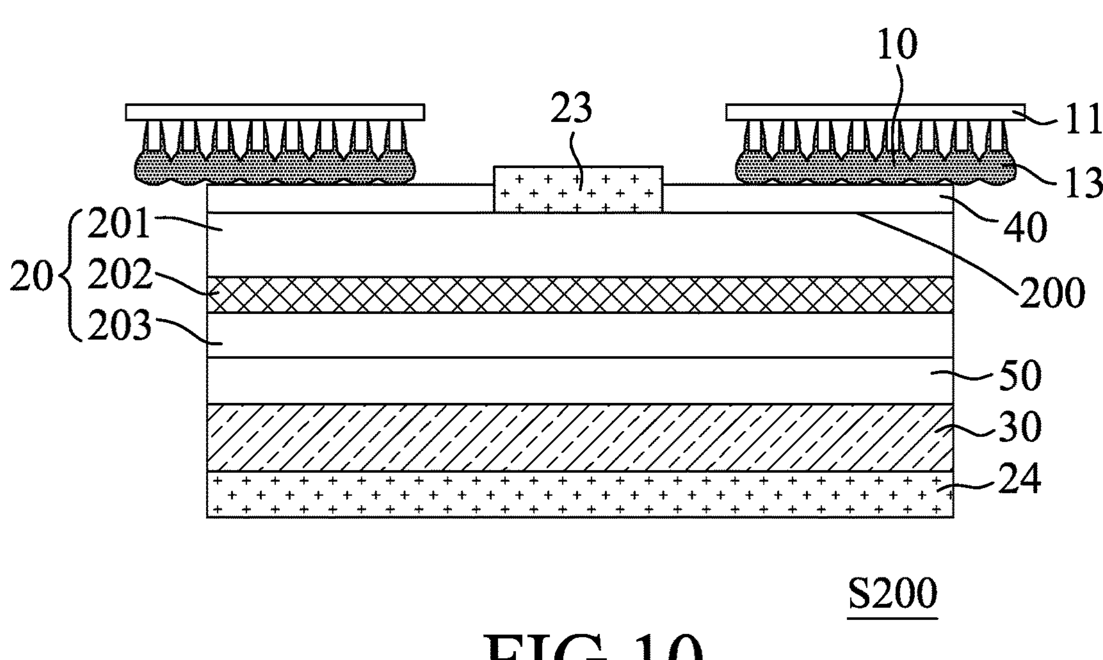
FIG. 10 is a schematic cross-sectional view illustrating a modification of the light emitting device of FIG. 9.

Referring to FIG. 10, a modification of the fourth embodiment of the light emitting device S200 of FIG. 9 is provided. The difference between FIG. 9 and FIG. 10 is described as below. In FIG. 9, the polarizer 10 is disposed on the epitaxial stack 20 with the light-transmissible substrate 11 facing toward the epitaxial stack 20; in FIG. 10, the polarizer 10 is disposed on the epitaxial stack 20 in a manner where the protective layer 13 is instead facing toward the epitaxial stack 20.

It should be noted that the structure of the light emitting device S200 in each of the aforementioned embodiments is merely for exemplary purposes, and the polarizer 10 according to the disclosure may also be applied to other light emitting devices with different structures.

Figure 11:
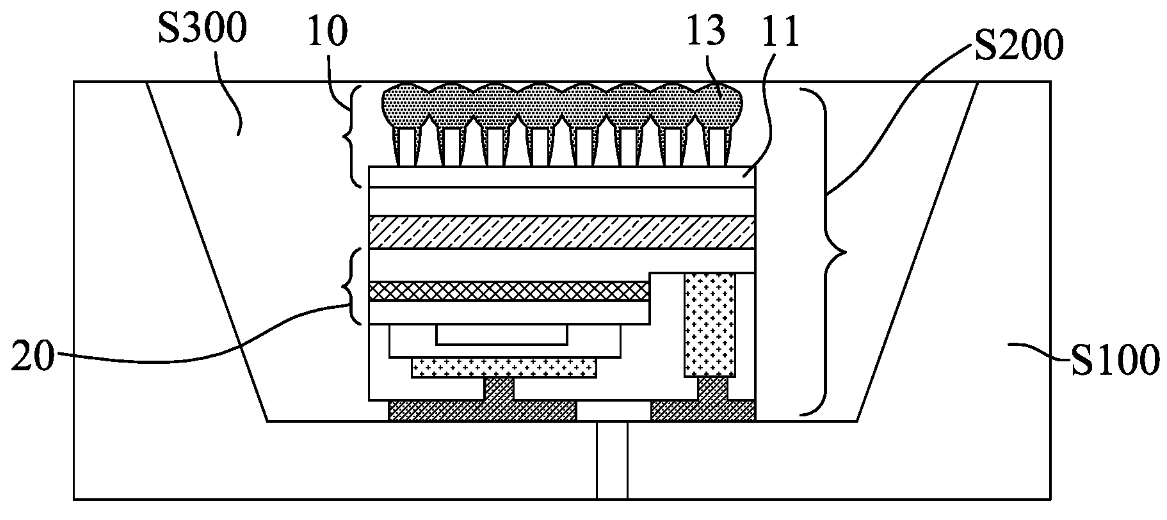
FIG. 11 is a schematic cross-sectional view illustrating an embodiment of a light emitting apparatus according to the disclosure.

Referring to FIG. 11, an embodiment of a light emitting apparatus according to the disclosure is provided. The light emitting apparatus includes a bracket S100, any one of the aforesaid light emitting devices S200 disposed on the bracket S100, and an encapsulant S300 encapsulating the light emitting device S200. Since a detailed description of the light emitting device S200 was given in the foregoing, details of the light emitting device S200 will be omitted in the following.

In some embodiments, the bracket S100 may be a platform-type bracket. In other embodiments, the bracket S100 includes a reflective cup in which a space is defined for installing the light emitting device S200.

In still other embodiments, the encapsulant S300 includes a transparent adhesive, a reflective adhesive, a black adhesive, other opaque adhesives, or combinations thereof.

Figure 12:
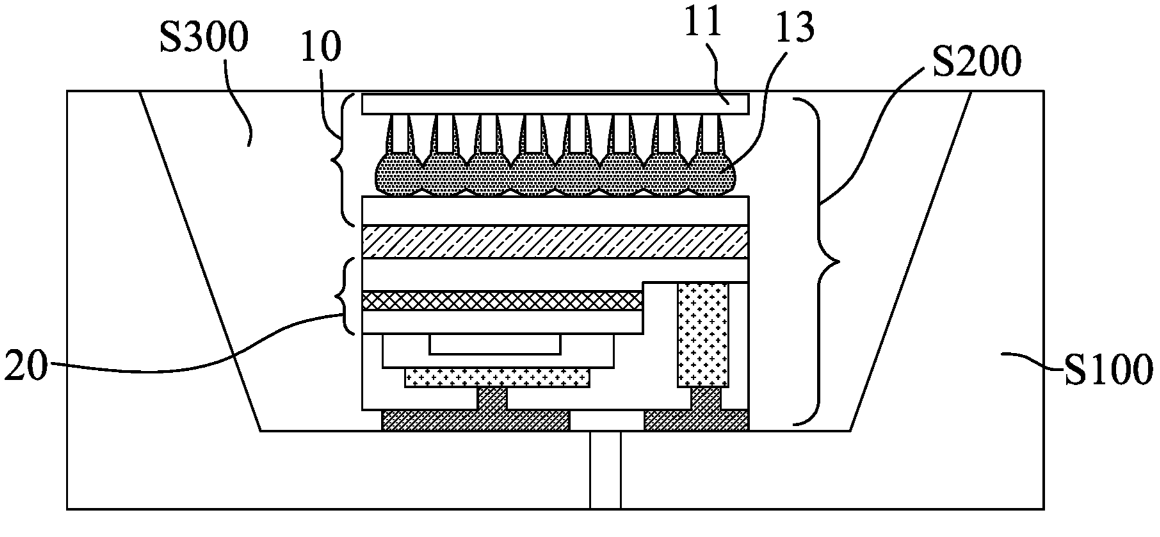
FIG. 12 is a schematic cross-sectional view illustrating a modification of the light emitting apparatus of FIG. 11.

Referring to FIG. 12, a modification of the light emitting apparatus of FIG. 11 is provided. The difference between FIG. 11 and FIG. 12 is described below. In FIG. 11, the polarizer 10 is disposed on the epitaxial stack 20 with the light-transmissible substrate 11 facing toward the epitaxial stack 20; in FIG. 12, the polarizer 10 is disposed on the epitaxial stack 20 in a manner where the protective layer 13 is instead facing toward the semiconductor epitaxial stack 20.

Based on the above, with the protective layer 13 that covers the upper surface 121 and the peripheral surface 122 of each of the metal wires 12, the metal wires 12 can be protected from being oxidized or corroded due to contact with the external environment, thereby enhancing the heat resistance and reliability of the polarizers 10. Since the protective layer 13 includes the first portion 131, which is disposed on the upper surface 121 of each of the metal wires 12, and the second portions 132, each of which is disposed on the peripheral surface 122 of the respective one of the metal wires 12, and since the first portion 131 is formed into the continuous structure (i.e., an integral structure) and the gap 14 is formed between two adjacent ones of the second portions 132, the light-polarizing performance of the polarizers 10 can be further improved.

Further, because the protective layer 13 is made of inorganic material(s), leading to the relatively poor adhesion between the protective layer 13 and the blue film (or a white film), and also because the first portion 131 of the protective layer 13 has a continuous structure, the metal wires 12 can be protected from being peeled off during the transferring process, thereby improving peeling resistance of the polarizers 10.

Last but not least, the thickness ($D_1$) of each of the second portions 132 may vary as a gradient in the direction away from the light-transmissible substrate 11 toward the first portion 131 of the protective layer 13 so as to obtain a gradient refractive index in the region between two adjacent ones of the metal wires 12, thereby reducing light loss due to reflection and consequently improving the light extraction efficiency of the polarizer 10.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A polarizer, comprising:

a light-transmissible substrate having a mounting surface;

a plurality of metal wires parallelly arranged on said mounting surface of said light-transmissible substrate, each of said metal wires extending in a direction parallel to said mounting surface, and having an upper surface which is distal from said mounting surface of said light-transmissible substrate and a peripheral surface which extends from a periphery of said upper surface to said mounting surface of said light-transmissible substrate; and a protective layer having a first portion and a plurality of second portions, said first portion covering said upper surface of each of said metal wires and being formed into a continuous structure, each of said second portions covering said peripheral surface of a respective one of said metal wires, two adjacent ones of said second portions being spaced apart from each other, wherein each of said second portions has a thickness which is not greater than 40% of a distance between the respective one of said metal wires and an adjacent one of said metal wires that is adjacent to the respective one of said metal wires.

2. The polarizer as claimed in claim 1, wherein each of said second portions has a thickness which is gradually increased in a direction away from the light-transmissible substrate toward said first portion of said protective layer.

3. The polarizer as claimed in claim 1, wherein said first portion of said protective layer has a thickness ranges from 10 nm to 500 nm.

4. The polarizer as claimed in claim 1, wherein said protective layer is made of silicon oxide, silicon nitride, silicon oxynitride, aluminum oxide, titanium oxide or combinations thereof.

5. The polarizer as claimed in claim 1, wherein said protective layer is made by atomic layer deposition, plasma-enhanced chemical vapor deposition (PECVD) or high density plasma chemical vapor deposition (HDPCVD).

6. The polarizer as claimed in claim 1, wherein said protective layer includes a first sublayer adjacent to said metal wires, and a second sublayer formed on said first sublayer opposite to said metal wires.

7. The polarizer as claimed in claim 6, wherein said first sublayer is made by atomic layer deposition, said second sublayer is made by PECVD or HDPCVD.

8. The polarizer as claimed in claim 6, wherein said first sublayer has a density higher than that of said second sublayer.

9. A light emitting device, comprising:

an epitaxial stack having a light emitting surface for at least a part of light generated by said epitaxial stack emitting outwardly therefrom; and a polarizer disposed on said light emitting surface of said epitaxial stack and including a light-transmissible substrate having a mounting surface;

a plurality of metal wires parallelly arranged on said mounting surface of said light-transmissible substrate, each of said metal wires extending in a direction parallel to said light emitting surface, and having an upper surface which is distal from said mounting surface of said light-transmissible substrate and a peripheral surface which extends from a periphery of said upper surface to said mounting surface of said light-transmissible substrate; and a protective layer having a first portion and a plurality of second portions, said first portion covering said upper surface of each of said metal wires and being formed into a continuous structure, each of said second portions covering said peripheral surface of a respective one of said metal wires, two adjacent ones of said second portions being spaced apart from each other by a gap, wherein each of said second portions has a thickness which is not greater than 40% of a distance between the respective one of said metal wires and an adjacent one of said metal wires that is adjacent to the respective one of said metal wires.

10. The light emitting device as claimed in claim 9, further comprising an intermediate layer disposed between said light emitting surface of said epitaxial stack and said polarizer, said intermediate layer being a wavelength conversion layer, a transparent insulating layer, or a transparent conductive layer.

11. The light emitting device as claimed in claim 9, wherein each of said second portions has a thickness which is gradually increased in a direction away from the light-transmissible substrate toward said first portion of said protective layer.

12. The light emitting device as claimed in claim 9, wherein said protective layer is made of silicon oxide, silicon nitride, silicon oxynitride, aluminum oxide, titanium oxide or combinations thereof.

13. A light emitting apparatus, comprising:

a bracket;

a light emitting device as claimed in claim 9 disposed on said bracket; and an encapsulant encapsulating said light emitting device.

14. The light emitting device as claimed in claim 9, wherein said protective layer includes a first sublayer adjacent to said metal wires, and a second sublayer formed on said first sublayer opposite to said metal wires.

15. The light emitting device as claimed in claim 14, wherein said first sublayer is made by atomic layer deposition, said second sublayer is made by PECVD or HDPCVD.

16. The light emitting device as claimed in claim 14, wherein said first sublayer has a density higher than that of said second sublayer.

17. A polarizer, comprising:

a light-transmissible substrate having a mounting surface;

a plurality of metal wires parallelly arranged on said mounting surface of said light-transmissible substrate, each of said metal wires extending in a direction parallel to said mounting surface, and having an upper surface which is distal from said mounting surface of said light-transmissible substrate and a peripheral surface which extends from a periphery of said upper surface to said mounting surface of said light-transmissible substrate; and a protective layer having a first portion and a plurality of second portions, said first portion covering said upper surface of each of said metal wires and being formed into a continuous structure, each of said second portions covering said peripheral surface of a respective one of said metal wires, two adjacent ones of said second portions being spaced apart from each other, wherein each of said second portions has a thickness which is first gradually decreased and then gradually increased in a direction away from the light-transmissible substrate toward said first portion of said protective layer.

* * * * *